United States Patent [19]

Fischer et al.

[11] 3,772,768

[45] Nov. 20, 1973

[54] METHOD OF PRODUCING A SOLAR CELL

[75] Inventors: Horst Fischer, Heilbronn; Willi Pschunder, Pleidelsheim, both of Germany

[73] Assignee: Licentia Patent-Verwaltungs-GmbH, Frankfurt am Main, Germany

[22] Filed: Feb. 9, 1971

[21] Appl. No.: 114,040

[30] Foreign Application Priority Data

Feb. 13, 1970 Germany .................. P 20 06 589.8

[52] U.S. Cl. ...................... 29/572, 29/589, 148/177, 136/89

[51] Int. Cl. ............................................ B01j 17/00

[58] Field of Search ...................... 29/589, 578, 572; 117/212, 227; 148/177, 181

[56] References Cited

UNITED STATES PATENTS

| | | | |
|---|---|---|---|
| 3,492,546 | 1/1970 | Rosvold | 29/589 |
| 3,669,730 | 6/1972 | Lepselter | 117/212 |

*Primary Examiner*—Charles W. Lanham
*Assistant Examiner*—W. Tupman
*Attorney*—Spencer & Kaye

[57] ABSTRACT

An improved method of producing a solar cell wherein a liquid metal-semiconductor phase is produced on a semiconductor body which has been previously provided with a p-n junction, the liquid metal-semiconductor phase is allowed to remain for a certain time before cooling it and then electrodes are attached to the semiconductor body.

15 Claims, 3 Drawing Figures

METHOD OF PRODUCING A SOLAR CELL

BACKGROUND OF THE INVENTION

The invention relates to a method of producing a solar cell.

Solar cells are photoelectric cells with semiconductor bodies of silicon or gallium arsenide which permit a direct conversion of radiation energy into electrical energy. Since they are used primarily in order to utilise the solar radiation as an energy source for producing electrical current, such photoelectric cells are generally termed "solar cells." They serve as a current source in some fields of engineering, for example, in space travel and providing a supply of current on board earth satellites, that is to say preferably in fields where substantially complete utilisation of the solar radiation is assured because of the absence of clouds.

The photoelectric current of a solar cell is proportional to the number of electron-hole pairs produced in the semiconductor material by the absorption of light. The current is partially reduced by the fact that the electron-hole pairs experience recombination on the diffusion path to the electrically active boundary transition. In order to obtain a high photoelectric current, therefore, the recombination must remain low, that is to say the minorities in the base material must have the longest possible lives or diffusion lengths.

The maximum accumulation of the electron-hole pairs produced is to be expected when the depth of penetration of the absorbed light is low in comparison with the diffusion length of the charge carriers. Thus silicon solar cells for example, the base of which is doped with boron, have maximum yields of the absorbed sunlight when the life of the charge carriers is above 25 $\mu$s. Longer lives do not, however, further improve the efficiency.

It is known that the life of the charge carriers in the raw material — for example, silicon doped with boron and having a specific resistance of about 10 ohm.cm such as is frequently used — has considerably higher values. Minority lives above 100 $\mu$s are observed.

During the processing of the semiconductor material, however, a considerable reduction occurs in the life so that the values have dropped to about 10 $\mu$s in the finished component. It can be assumed that the mechanical processing of the semiconductor body or diffusion operations therein or thermal influencing during vapour-deposition and sintering in of the contacts should be regarded as causes of the reduction in the carrier lifetime.

SUMMARY OF THE INVENTION

It is the object of the invention to enable the regeneration of the carrier lifetime, which is sufficiently long to obtain optimum current yields in the raw material but drops to a fraction of the necessary length during the further course of the processing, and to enable it to be brought as close to the optimum value of about 25 $\mu$s as possible.

According to the invention, there is provided a method of producing a solar cell, comprising forming a p-n junction in a semiconductor body, thereafter producing a liquid metal-semiconductor phase on said semiconductor body, allowing the liquid metal-semiconductor phase to remain for a certain period of time, cooling the metal-semiconductor stage and then applying electrodes to the semiconductor body.

DESCRIPTION OF THE PREFERRED EMBODIMENT

Basically, the invention consists in that a liquid metal-semiconductor phase which is produced on the semiconductor body already provided with a p-n junction, before the fitting of the electrodes, is left for a certain period of time and is then cooled.

Figure 1:
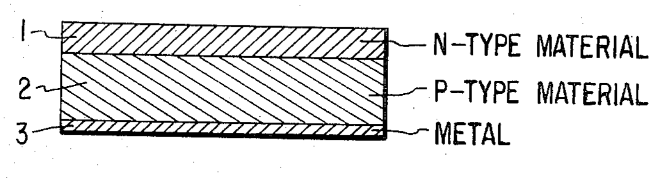
FIGS. 1–3 show cross-sectional views of a solar cell at various steps of production according to the method of the present invention.

As shown in FIG. 1, the semiconductor body used to produce the solar cell includes a region 1 of n-type conductivity overlying a region 2 of p-type conductivity, thus forming a p-n junction therebetween. The liquid metal-semiconductor phase is preferably produced at that side of the semiconductor body at which the back contact is fitted. Therefore, a layer of metal 3, which forms an ohmic contact is applied to the surface of the region 2. The semiconductor body 1, 2 with the metal layer 3 is then heated and the resulting liquid metal-semiconductor phase is left until there is thermal equilibrium between the solid and the liquid phase. The liquid metal-semiconductor phase is brought, by heating, to a temperature above the melting point of the metal-semiconductor phase.

Figure 2:
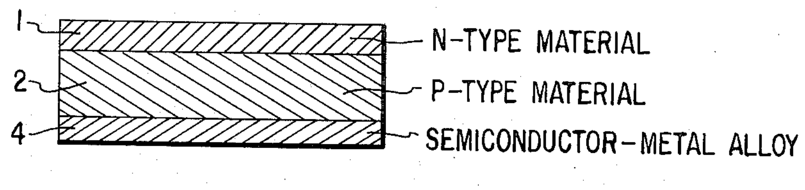

The heating temperature above the eutectic temperature of the metal-semiconductor phase is selected high enough that, apart from the semiconductor body, only a semiconductor-metal alloy 4 (as shown in FIG. 2), which also forms an ohmic contact with the semiconductor body, remains after the cooling. Thus, with this method, apart from the semiconductor body and the semiconductor-metal alloy, there should not be any pure metal present after the cooling or recrystallisation, as during the production of alloy devices. During the cooling of the metal-semiconductor melt, it is advisable to cool first to a temperature below the eutectic temperature of the metal-semiconductor phase and only to cool down to room temperature afterwards.

The eutectic temperature of the metal-semiconductor phase is selected low enough that no harmful influence is caused to the semiconductor body. The vapour pressure of the metal component of the metal-semiconductor phase should be low enough so that no metal evaporates from the liquid phase.

Figure 3:
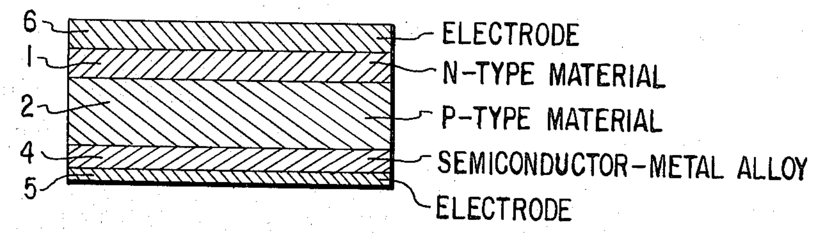

After cooling of the metal-semiconductor alloy layer 4, as shown in FIG. 3, the back contact or electrode 5 and the front contact or electrode 6 are applied in a conventional manner to the opposite surfaces of the semiconductor body.

The semiconductor body may consist of silicon, for example, while the metal which is applied to the semiconductor body before the production of the semiconductor electrodes, may consist of aluminium or an aluminium alloy for example. A gallium-aluminium alloy is a suitable aliuminium alloy.

The metal layer is vapour-deposited for example. The thickness of the metallic layer may amount to from 1 to 10$\mu$ for example. In general, a thickness from 2 to 3$\mu$ is selected.

When using a semiconductor body of silicon and the metal aluminium, the coated solar cell is maintained at a temperature above the eutectic temperature for about 10 to 15 minutes.

When using a semiconductor body of silicon and the metal aluminium, the heat treatment of the solar cell may be carried out at a temperature of about 700° to 750° C. for example. The rate of cooling from the eutectic temperature to room temperature may amount to 1° to 20° C per minute for example. In general, however, a cooling rate of from 5° to 10° C per minute is preferred.

Subsequent to the production of the liquid, the contacts are metal-semiconductor phase fitted to the solar cell and so production of the device is completed.

The method according to the invention ensures that the efficiency of the solar cells is distinctly improved in comparison with those solar cells produced by conventional methods. In the usual cells with wafers about 300$\mu$m thick, an increase in efficiency of about 10 percent has been observed as a result of the invention; with thinner cells, having wafers about 150$\mu$m thick, such as have been used recently in generators, the gain in power is still more pronounced and is about 13 percent. Not only is a gradual improvement achieved as a result of this method, but a novel type of solar cell is practically obtained.

A further advantage of the method according to the invention is to be seen in the fact that the diffusion process, which only takes place at 830° C, is not unfavorably influenced by the heat treatment, the optimum temperature for which is 750° C.

In addition, the back contact — for example, a titanium-silver alloy — can be fitted to the back of the solar cell by conventional methods without the effect of the regeneration of the carrier lifetime being reversed as a result. The aluminium vapour-deposited on the back is actually completely dissolved by the silicon at the treatment temperature and precipitated again as a silicon aluminium eutectic during the cooling. Since this eutectic is highly conducting, the production of an ohmic back contact is additionally facilitated.

The aluminium-silicon or aluminium-gallium-silicon phases according to the invention represent an advantageous selection and further development insofar as their eutectic temperature is sufficiently low to produce a liquid phase at the surface of the semiconductor and hence to permit the diffusion and segregation of the impurities in times which are tolerable from the manufacturing point of view, but on the other hand do not cause any harmful thermal influencing of the semiconductor body — for example, stressing. There is a further advantage in the low vapour pressure of the metallic component of the liquid metal-silicon phase, as a result of which metal is prevented from being evaporated from the liquid phase.

It will be understood that the above description of the present invention is susceptible to various modifications, changes and adaptations.

What is claimed is:

1. A method of producing a solar cell, comprising the steps of:

forming a p-n junction in a semiconductor body, forming a metal layer on one surface of said semiconductor body, thereafter heating said semiconductor body including said metal layer to a temperature sufficiently high above the metal-semiconductor eutectic temperature to produce a liquid metal-semiconductor phase on said one surface of said semiconductor body, maintaining said liquid metal-semiconductor phase on said one surface of said semiconductor body for a period of time until thermal equilibrium is reached between the solid and liquid phases such that all of the metal become alloyed with the material of the semiconductor body, cooling said liquid metal-semiconductor phase to recrystallize same so that only a metal-semiconductor alloy remains on said one surface of said semiconductor body so as to form an ohmic contact between the metal-semiconductor alloy and the unalloyed portion of the semiconductor body, and thereafter applying electrodes to said semiconductor body, with at least one electrode being applied to said metal-semiconductor alloy at said one surface and another electrode to the opposite surface of the semiconductor body.

2. A method as defined in claim 1, further comprising producing said liquid metal-semiconductor phase at that side of the semiconductor body to which the electrode forming the back contact is applied.

3. A method as defined in claim 1, wherein during said cooling of said liquid metal-semiconductor phase, cooling is first effected to a temperature below the eutectic temperature of said metal-semiconductor phase and only afterwards down to room temperature.

4. A method as defined in claim 1, wherein the eutectic temperature of the metal-semiconductor phase is selected so low that no harmful influence is caused on the semiconductor body.

5. A method as defined in claim 1, wherein the vapour pressure of the metal component of said metal-semiconductor phase is so low that no metal evaporates from the liquid phase.

6. A method as defined in claim 1, wherein said semiconductor body is formed of silicon.

7. A method as defined in claim 6, wherein the metal of said metal-semiconductor phase comprises an aluminium alloy.

8. A method as defined in claim 6, wherein the metal of said metal-semiconductor phase comprises a gallium-aluminium alloy.

9. A method as defined in claim 1, where the step of forming said metal layer is by vapour-deposition of said metal on said semiconductor body.

10. A method as defined in claim 1, wherein the metal of said metal layer which is applied to said semiconductor body has a thickness of about 1 to 10$\mu$m.

11. A method as defined in claim 1, wherein the metal of said metal layer which is applied to said semiconductor body has a thickness of about 2 to 3$\mu$m.

12. A method as defined in claim 1, wherein said semiconductor body is formed of silicon and the metal of said metal layer comprises aluminium and wherein said heating continues above the eutectic temperature for about 10 to 15 minutes.

13. A method as defined in claim 1 wherein said semiconductor body is formed of silicon and the metal of said metal layer comprises aluminium and wherein said semiconductor body is heated to a maximum temperature of about 700° to 750° C for forming said liquid metal-semiconductor stage.

14. A method as defined in claim 1, wherein said semiconductor body is formed of silicon and the metal of said metal layer comprises aluminium and wherein said metal semiconductor phase is cooled from its eutectic temperature to room temperature at a rate of about 1° to 20° C per minute.

15. A method as defined in claim 1, wherein said semiconductor body is formed of silicon and the metal of said metal layer comprises aluminium and wherein said metal semiconductor phase is cooled from its eutectic temperature to room temperature at a rate of about 5° to 10° C per minute.

* * * * *